(12) United States Patent
Hondo et al.

(10) Patent No.: US 9,252,096 B2
(45) Date of Patent: Feb. 2, 2016

(54) WIRING SUBSTRATE AND METHOD OF MANUFACTURING THE SAME

(71) Applicant: Shinko Electric Industries Co., Ltd., Nagano-shi (JP)

(72) Inventors: Yoshiaki Hondo, Nagano (JP); Hirofumi Takeuchi, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 13/917,818

(22) Filed: Jun. 14, 2013

(65) Prior Publication Data

US 2013/0334703 A1    Dec. 19, 2013

(30) Foreign Application Priority Data

Jun. 15, 2012   (JP) .................... 2012-135592

(51) Int. Cl.
*H01L 23/498* (2006.01)
*H01L 23/14* (2006.01)
*H01L 23/64* (2006.01)
*H01L 21/48* (2006.01)
*H01L 23/538* (2006.01)
*H05K 1/02* (2006.01)
*H05K 3/46* (2006.01)

(52) U.S. Cl.
CPC ........ *H01L 23/49827* (2013.01); *H01L 23/145* (2013.01); *H05K 3/4673* (2013.01); *H01L 21/4857* (2013.01); *H01L 23/49822* (2013.01); *H01L 23/49838* (2013.01); *H01L 23/5383* (2013.01); *H01L 23/642* (2013.01); *H01L 2224/16225* (2013.01); *H01L 2224/32225* (2013.01); *H01L 2224/73204* (2013.01); *H01L 2924/15311* (2013.01); *H05K 1/0271* (2013.01); *H05K 3/4602* (2013.01); *H05K 2201/0195* (2013.01); *H05K 2201/029* (2013.01)

(58) Field of Classification Search
CPC .. H05K 3/02; H01L 23/145; H01L 23/49827; H01L 23/49822; H01L 23/4857; H01L 23/49838; H01L 23/5383; H01L 23/642
See application file for complete search history.

(56) References Cited

U.S. PATENT DOCUMENTS

| | | | |
|---|---|---|---|
| 2005/0153059 A1* | 7/2005 | Wakizaka | 427/96.1 |
| 2010/0243601 A1 | 9/2010 | Uematsu | |
| 2011/0016709 A1* | 1/2011 | Mizutani et al. | 29/847 |
| 2012/0043123 A1* | 2/2012 | Takada et al. | 174/258 |

FOREIGN PATENT DOCUMENTS

| | | |
|---|---|---|
| JP | 2010-10329 A1 | 1/2010 |
| JP | 2010-232418 A1 | 10/2010 |
| JP | 2011-181630 A1 | 9/2011 |

* cited by examiner

*Primary Examiner* — William Harriston
(74) *Attorney, Agent, or Firm* — Kratz, Quintos & Hanson, LLP (57) ABSTRACT

A wiring substrate includes a core substrate including a first wiring layer, an interlayer insulating layer formed by a resin layer containing fiber reinforcement material formed on the core substrate and a primer layer formed on the resin layer containing fiber reinforcement material, and the interlayer insulating layer having a via hole reaching the first wiring layer, and a second wiring layer formed on the primer layer, and connected to the first wiring layer through the via hole.

4 Claims, 7 Drawing Sheets

WIRING SUBSTRATE AND METHOD OF MANUFACTURING THE SAME

CROSS-REFERENCE TO RELATED APPLICATIONS

This application is based upon and claims the benefit of priority of the prior Japanese Patent Application No. 2012-135592, filed on Jun. 15, 2012, the entire contents of which are incorporated herein by reference.

FIELD

The invention is related to a wiring substrate and a method of manufacturing the same.

BACKGROUND

In the prior art, there are the wiring substrates for mounting the electronic component such as the semiconductor chip, or the like. In one example of such wiring substrates, the build-up wiring is formed on both surface sides of the core substrate made of a glass epoxy resin, or the like respectively. In recent years, the miniaturization and the higher performance, etc. of the electronic component devices are demanded, in order to respond to such demands, a reduction in thickness of the core substrate of the wiring substrate is advanced.

A related art is disclosed in Japanese Laid-open Patent Publication No. 2011-181630, Japanese Laid-open Patent Publication No. 2010-232418, and Japanese Laid-open Patent Publication No. 2010-10329.

As explained in the column of preliminary matter described later, when the core substrate of the wiring substrate is thinned, sufficient rigidity cannot be obtained. As a result, there exists such a problem that a twist or a warp is caused in the wiring substrate by the heating process, or the like in the steps of manufacturing the wiring substrate.

SUMMARY

According to one aspect discussed herein, there is provided a wiring substrate, which includes a core substrate including a first wiring layer, an interlayer insulating layer formed by a resin layer containing fiber reinforcement material formed on the core substrate and a primer layer formed on the resin layer containing fiber reinforcement material, and the interlayer insulating layer having a via hole reaching the first wiring layer, and a second wiring layer formed on the primer layer, and connected to the first wiring layer through the via hole.

Also, according to another aspect discussed herein, there is provided a method of manufacturing a wiring substrate, which includes obtaining an interlayer insulating layer by forming a laminated body, in which a resin layer containing fiber reinforcement material and a primer layer are laminated in sequence, on a core substrate including a first wiring layer, forming a via hole reaching the first wiring layer, by processing the interlayer insulating layer, and forming a second wiring layer connected to the first wiring layer through the via hole, on the primer layer.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENT

An embodiment will be explained with reference to the accompanying drawings hereinafter.

Figure 1:
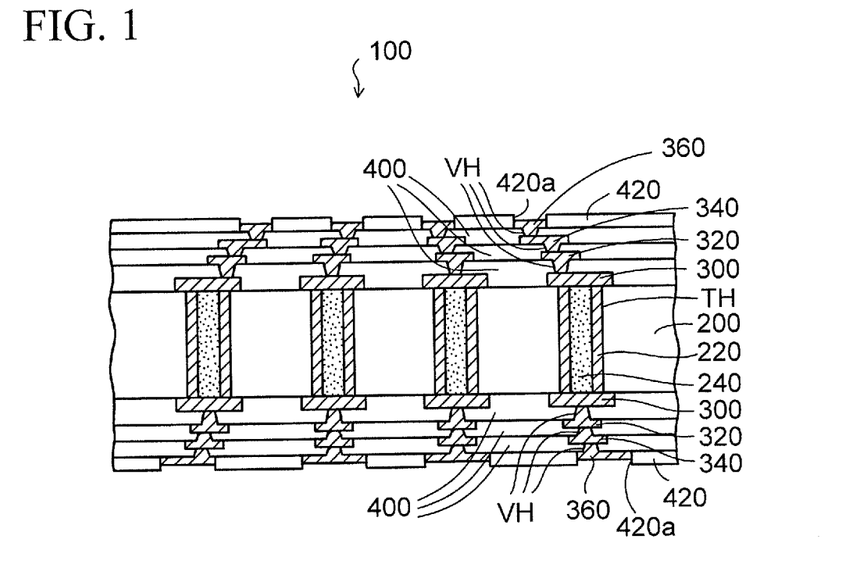
FIG. 1 is a sectional view depicting a wiring substrate according to the preliminary matter.

Prior to the explanation of an embodiment, the preliminary matter to be set forth as a basis will be explained hereunder. As depicted in FIG. 1, in a wiring substrate 100 according to the preliminary matter, a core substrate 200 is arranged in a center part in the thickness direction. Through holes TH are formed in the core substrate 200, and a through hole plating layer 220 is formed on inner walls of the through holes TH respectively. Also, a resin 240 is filled in remaining holes of the through holes TH respectively.

Also, first wiring layers 300 connected mutually via the through hole plating layer 220 are formed on both surface sides of the core substrate 200 respectively. Also, second, third, and fourth wiring layers 320, 340, 360 are stacked sequentially on the first wiring layer 300 on both surface sides of the core substrate 200 respectively.

The first to fourth wiring layers 300, 320, 340, 360 on both surface sides are stacked via an interlayer insulating layer 400 which is arranged between respective wiring layers. Then, the first to fourth wiring layers 300, 320, 340, 360 are connected through a via hole VH which is formed in respective interlayer insulating layers 400 respectively.

Also, a solder resist 420 in which opening portions 420a are provided on the connection parts of the fourth wiring layers 360, is formed on both surface sides of the core substrate 200 respectively.

The core substrate 200 is formed of a glass epoxy resin, and its thickness is 400 μm to 800 μm. The core substrate 200 is a rigid substrate which has a relatively thick thickness, and has sufficient rigidity. As a result, even though the heating process, or the like are performed repetitively in the steps of manufacturing the wiring substrate, the twist or the warp is not caused in the wiring substrate.

In recent years, the miniaturization and higher performance, etc. of the electronic component device are demanded, in order to respond to such demands, a reduction in thickness of the core substrate 200 of the wiring substrate 100 is advanced.

Figure 2:
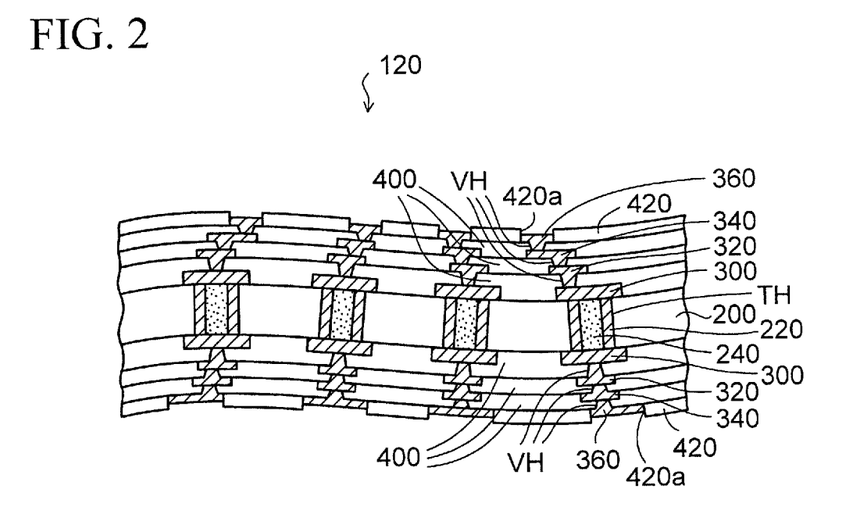
FIG. 2 is a sectional view for explaining the problem of the wiring substrate according to the preliminary matter.

In FIG. 2, in the wiring substrate 100 in FIG. 1, a wiring substrate 120 in which a thickness of the core substrate 200 is thinned to 100 µm to 200 µm is depicted. In FIG. 2, other elements are similar to those in FIG. 1.

When a thickness of the core substrate 200 of the wiring substrate 120 is thinned to 100 µm to 200 µm, rigidity of the core substrate 200 is considerably weakened, so that the core substrate 200 can no longer constitute the rigid substrate. Accordingly, as depicted in FIG. 2, when the heating process, or the like are performed repetitively in the steps of manufacturing the wiring substrate, the core substrate 200 cannot withstand a thermal stress generated in the inside thereof. As a result, such a problem exists that the twist or the warp is caused in the wiring substrate 120.

According to the embodiment explained in the following, the above-mentioned drawback can be solved.

(Embodiment)

Figure 5A:
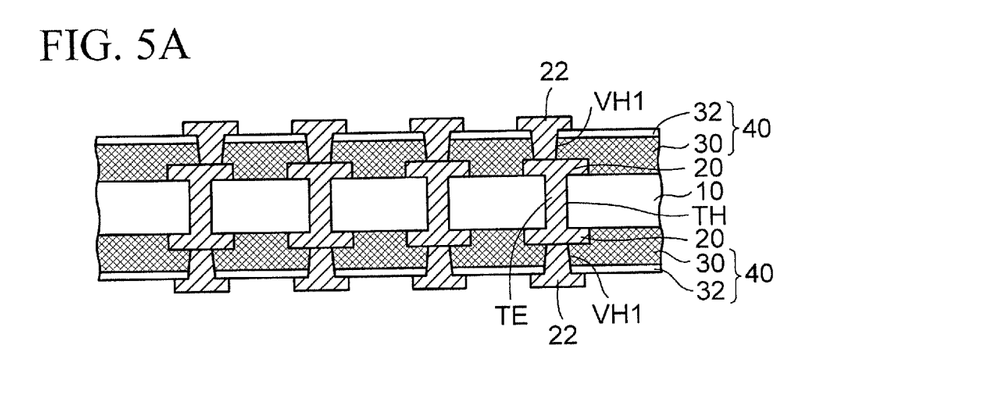
FIGS. 5A to 5C are sectional views (#3) depicting the method of manufacturing the wiring substrate according to the embodiment.
Figure 5B:
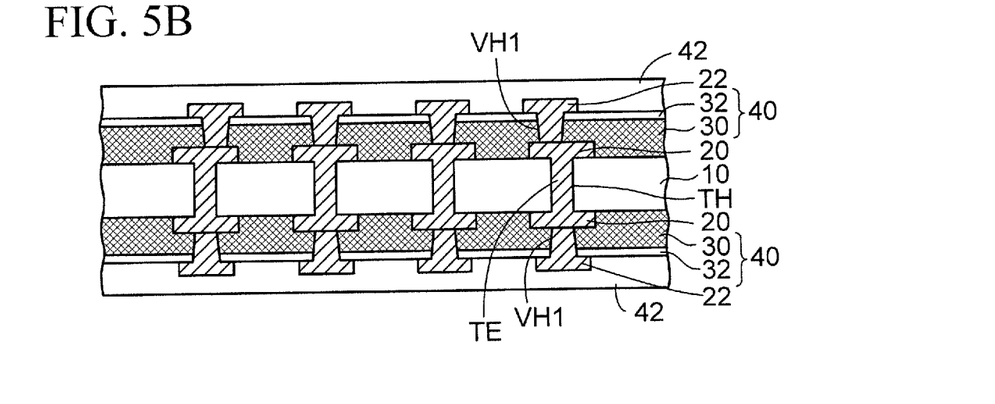
Figure 5C:
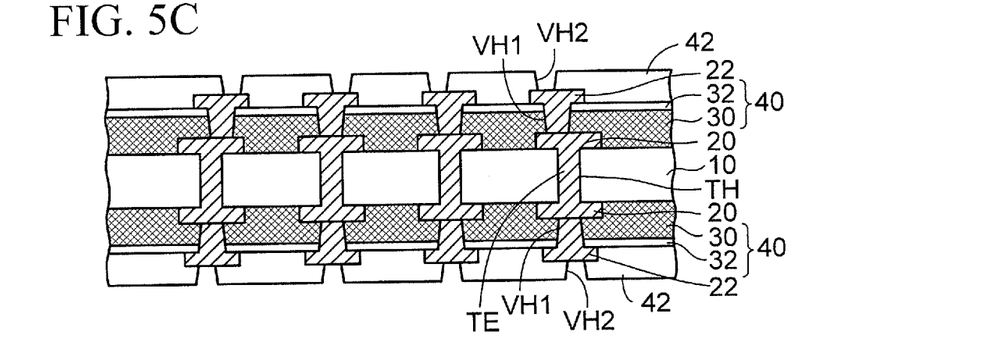
Figure 6A:
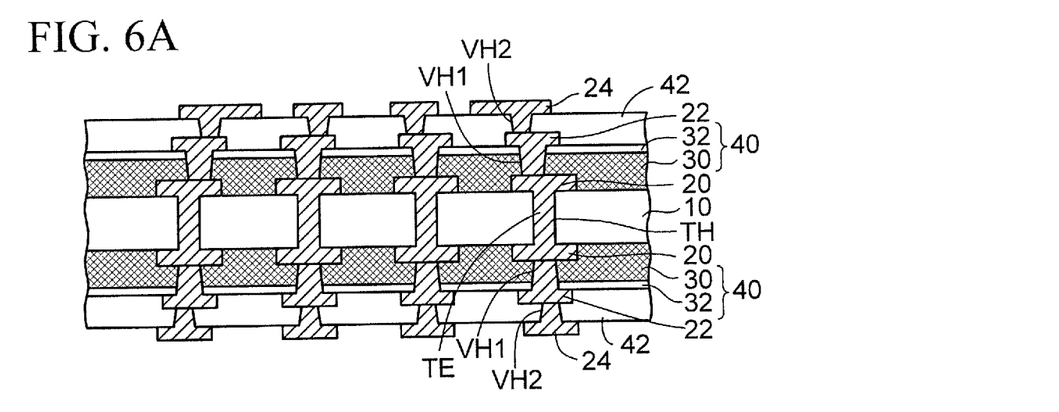
FIGS. 6A to 6C are sectional views (#4) depicting the method of manufacturing the wiring substrate according to the embodiment.
Figure 6B:
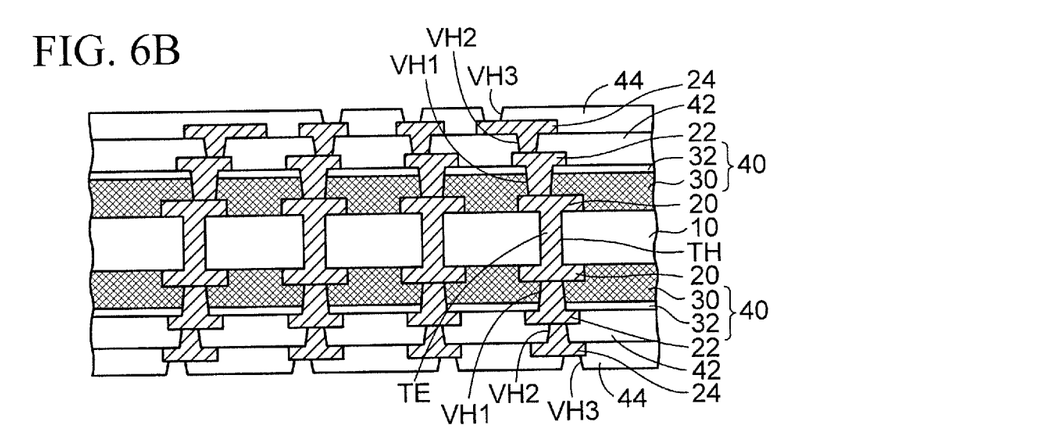
Figure 6C:
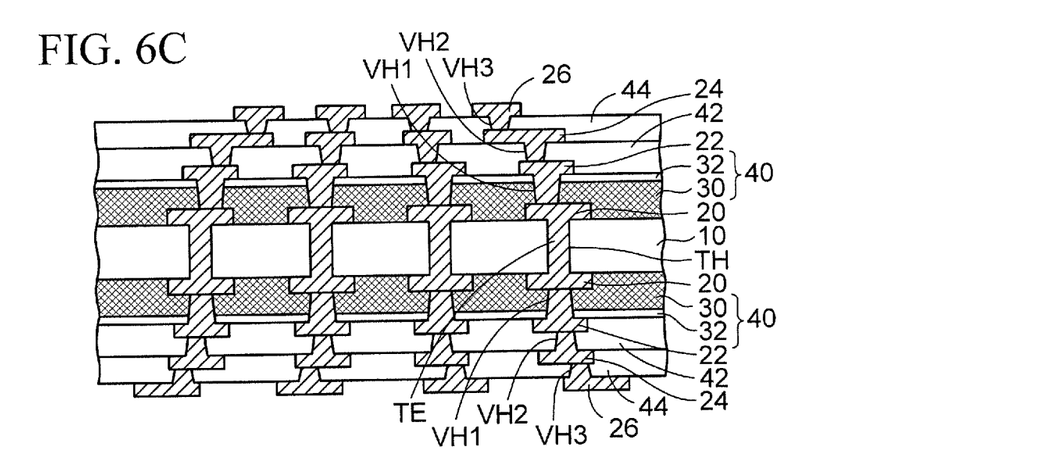
Figure 7:
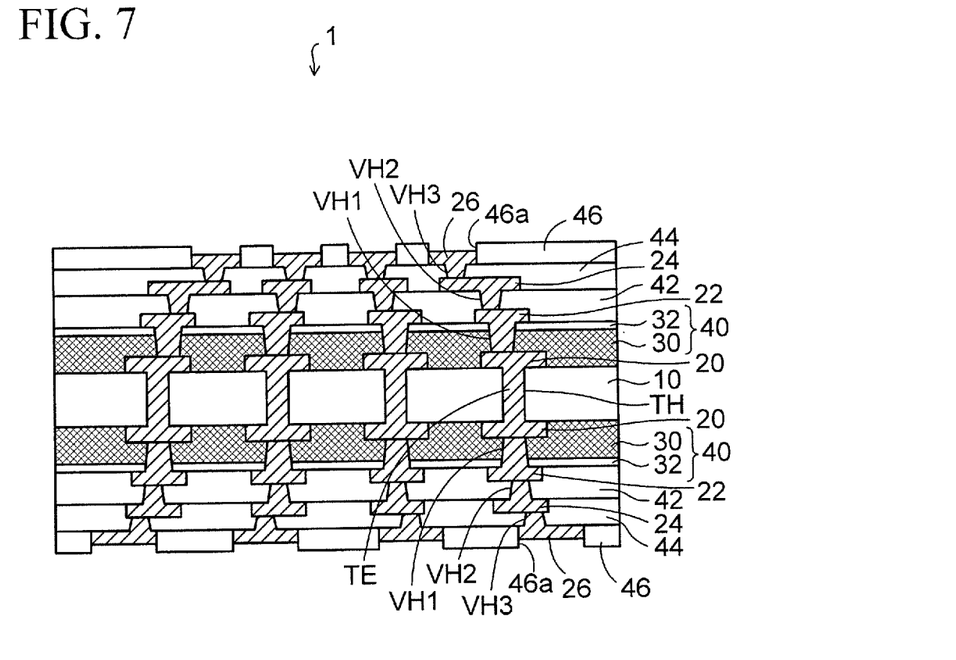
FIG. 7 is a sectional view depicting the wiring substrate according to the embodiment.

FIG. 3A to FIG. 6C are sectional views depicting a method of manufacturing a wiring substrate according to an embodiment, and FIG. 7 is a sectional view depicting the wiring substrate according to the embodiment. While explaining a method of manufacturing a wiring substrate according to the embodiment, a structure of a wiring substrate will be explained hereinafter.

Figure 3A:
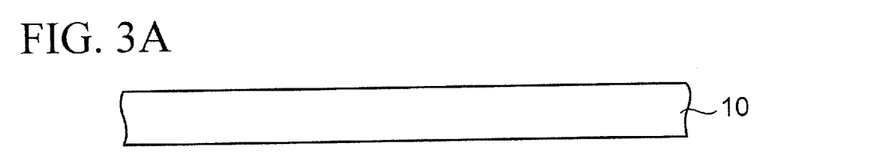
FIGS. 3A to 3E are sectional views (#1) depicting a method of manufacturing a wiring substrate according to an embodiment.

In the method of manufacturing the wiring substrate according to the embodiment, as depicted in FIG. 3A, first, a core substrate 10 formed of insulating resin material is prepared. Preferably the core substrate 10 is formed of resin which contains a fiber reinforcement material such as a glass epoxy resin, or the like. In this case, the core substrate 10 may be formed of a resin film such as a polyimide film, or the like. The core substrate 10 is made to the thinner body in a thickness of about 100 µm to 200 µm, and does not have sufficient rigidity.

Figure 3B:
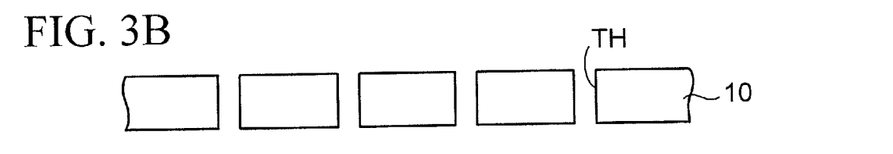

Then, as depicted in FIG. 3B, the core substrate 10 is penetration-processed in the thickness direction by a router, a die stamping machine, or the like, and thus through holes TH are formed. A diameter of the through hole TH is about 50 µm to 100 µm, for example. In the case that the large size core substrate 10 for the purpose of multi production is used, the through holes TH are formed in respective product areas, which are demarcated in plural on the core substrate 10 respectively.

Figure 3C:
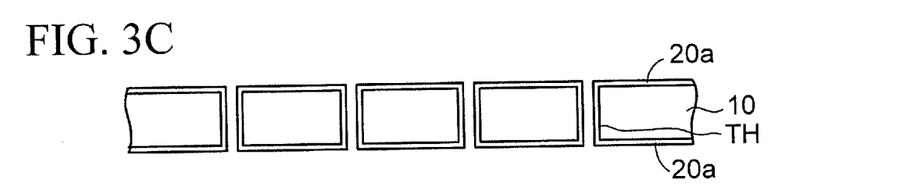
Figure 3D:
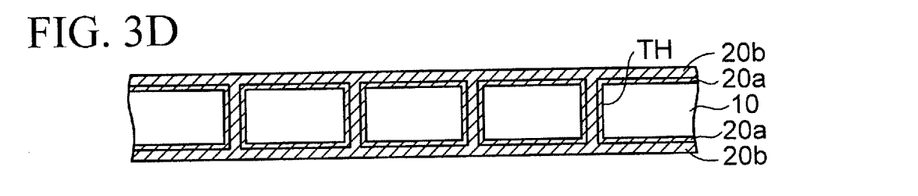

Then, as depicted in FIG. 3C, a seed layer 20a such as a copper layer, or the like is formed on both surfaces of the core substrate 10 and inner walls of the through holes TH by the electroless plating. Then, as depicted in FIG. 3D, a metal plating layer 20b is formed on the seed layer 20a, which is formed on both surface sides of the core substrate 10 and on the inner walls of the through holes TH, by the electroplating. This electroplating utilizes the seed layer 20a as the plating power feeding path. The metal plating layer 20b is formed to fill the inside of the through holes TH.

Figure 3E:
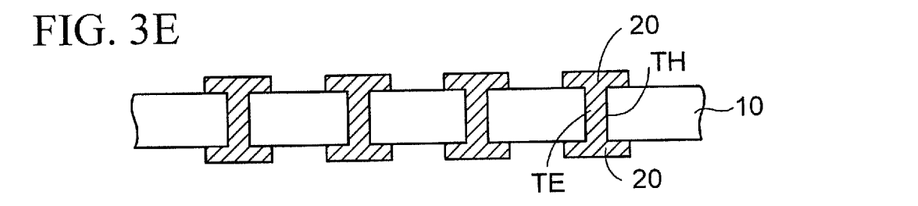

Then, as depicted in FIG. 3E, the metal plating layer 20b and the seed layer 20a are patterned on both surface sides of the core substrate 10 by the photolithography and the wet etching. Thus, first wiring layers 20 are formed on both surface sides.

The first wiring layer 20 is formed by the seed layer 20a and the metal plating layer 20b, and a thickness of the whole layer is 20 µm to 50 µm, for example. The first wiring layer 20 on both surface sides is connected mutually via penetration electrodes TE each of which is filled in the through holes TH.

Here, besides the example in FIG. 3E, the penetration electrode TE may be formed on the inner walls of the through holes TH as a through hole plating layer respectively, and then remaining holes of the through holes TH may be filled with a resin. That is, any mutual connection may be used if the first wiring layer 20 on both surface sides is connected mutually via a conductor layer which is formed in the through hole TH.

Figure 4A:
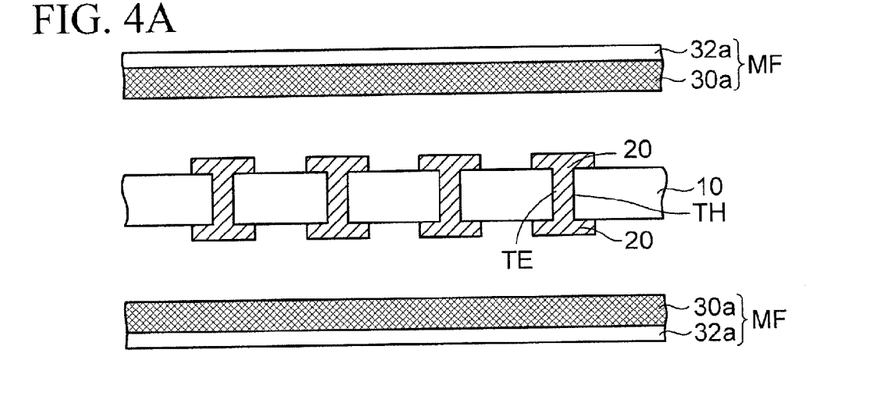
FIGS. 4A to 4D are sectional views (#2) depicting the method of manufacturing the wiring substrate according to the embodiment.

Then, as depicted in FIG. 4A, a laminated film MF in which a primer film 32a is adhered to one face of a resin film containing fiber reinforcement material 30a is prepared.

The resin film containing fiber reinforcement material 30a corresponds to the film that is formed by impregnating the fiber reinforcement such as glass fiber, aramid fiber, carbon fiber, or the like with a thermosetting resin, e.g., an epoxy resin, and then heating/drying the resultant body to make the resultant body a semi-cured state (B-state). The resin film containing fiber reinforcement material 30a is used as the reinforcement material for giving sufficient rigidity to the core substrate 10 formed of the thin film.

The primer film 32a is formed of an epoxy resin, a polyimide resin, or the like, which is kept in a semi-cured state (B-state). This primer film 32a functions as an adhesive layer for forming the wiring layer with good adhesion.

In both the resin film containing fiber reinforcement material 30a and the primer film 32a, silica fillers may be dispersed in the resin.

Then, the face of the resin film containing fiber reinforcement material 30a in the laminated film MF is arranged on both surfaces of the structural body in FIG. 3E respectively, and then the resultant body is thermally pressed at a temperature of 190° C. to 200° C. by the die, or the like. By this matter, the resin film containing fiber reinforcement material 30a and the primer film 32a are melted and fluidized, and then are cured on both surface sides of the core substrate 10.

Figure 4B:
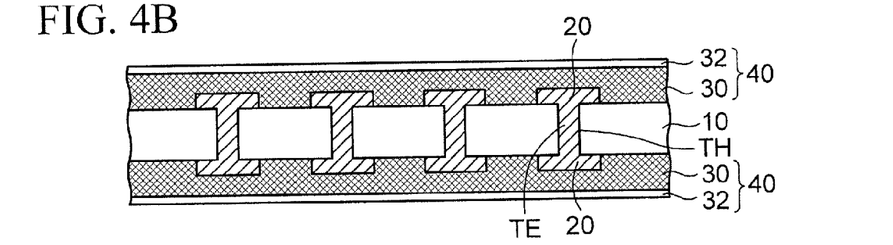

In this matter, as depicted in FIG. 4B, a resin layer containing fiber reinforcement material 30 which is formed by the resin film fiber containing reinforcement material 30a is obtained on both surface sides of the core substrate 10 respectively. Also, the resin layers containing fiber reinforcement material 30 on both surface sides are formed respectively in such a state that a primer layer 32 formed by the primer film 32a is adhered to the outer face thereof.

For example, a thickness of the resin layer containing fiber reinforcement material 30 is 40 µm to 60 µm, and a thickness of the primer layer 32 is 10 µm to 20 µm.

By the matter that the resin film containing fiber reinforcement material 30a is melted and fluidized, space areas between the first wiring layers 20 can be filled with the resin, and thus a level difference due to the first wiring layers 20 can be eliminated. As a consequence, the outer faces of the primer layers 32 on both surface sides are formed to be made to a flat surface respectively.

Also, by forming the resin layer containing fiber reinforcement material 30 on both surfaces of the core substrate 10 whose rigidity is weakened by the thinner body, the rigidity of the core substrate 10 can be reinforced. Accordingly, even though the heating process, etc. are performed repetitively in various manufacturing steps when forming the multilayer wirings later, such an event can be prevented that the twist or the warp is caused in the core substrate 10.

Also, in the present embodiment, the primer layer 32 is formed on the resin layer containing fiber reinforcement material 30. As described later, the wiring layers are formed on the primer layer 32 based on the plating method. In order to form the wiring layers with good reliability, it is necessary to ensure the adhesion by means of the anchor effect by forming a surface of the underlying layer of the wiring layers as a roughened surface.

It is difficult to roughen the surface of the resin layer containing fiber reinforcement material 30 adequately. Therefore, when the wiring layers are formed directly on the resin layer containing fiber reinforcement material 30, sufficient adhesion of the wiring layers cannot be obtained.

For this reason, in the present embodiment, the primer layer 32 made of an epoxy resin, or the like, whose surface can be easily roughened, is formed on the resin layer containing fiber reinforcement material 30, so that the wiring layers can be formed on the primer layer 32 with good adhesion.

Here, in the examples in FIGS. 4A and 4B, the resin layer containing fiber reinforcement material 30 and the primer film 32a are formed by pasting the laminated film MF. In this case, the resin layer containing fiber reinforcement material 30 may be formed on both surface sides of the core substrate 10, and then the primer layer 32 may be laminated thereon respectively.

That is, a laminated body in which the resin layer containing fiber reinforcement material 30 and the primer layer 32 are laminated in sequence from the inner side may be formed on both surface sides of the core substrate 10.

Like the above, a first interlayer insulating layer 40 which is formed by the resin layer containing fiber reinforcement material 30 and the primer layer 32 is obtained on both surface sides of the core substrate 10 respectively.

Figure 4C:
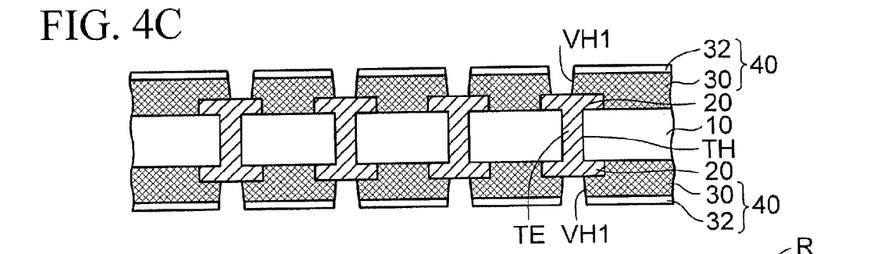

Then, as depicted in FIG. 4C, the primer layer 32 and the resin layer containing fiber reinforcement material 30 are processed by the laser on both surface sides of the core substrate 10 respectively. Thus, first via holes VH1, each reaching the first wiring layer 20, are formed on both surface sides respectively.

Figure 4D:
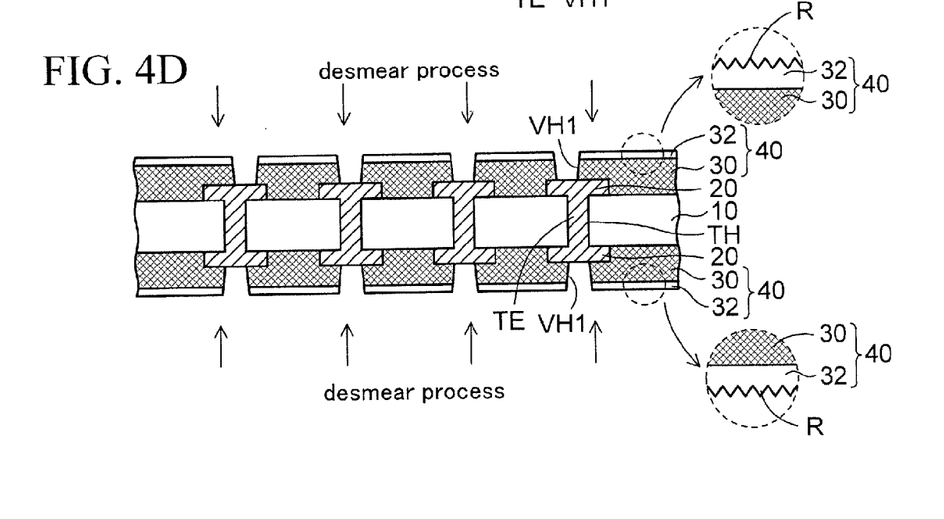

After this, as depicted in FIG. 4D, the resin smear in the first via holes VH1 is cleaned to be removed by the desmear process such as the potassium permanganate method, or the like. At this time, the surface of the primer layer 32 is subjected to the desmear process simultaneously.

By this matter, as depicted in a fragmental enlarged sectional view in FIG. 4D, unevenness is formed on the surface of the primer layer 32, thus the surface becomes a roughened surface R. Surface roughness (Ra) of the primer layer 32 is 100 nm to 600 nm, for example, thereby when the wiring layer is formed, the enough anchor effect can be obtained.

Alternatively, the desmear process may be performed by the plasma process using a gas such as $CF_4$, or the like. In this case, the surface of the primer layer 32 can also be formed as the adequate roughened surface R. The plasma process is performed by the dry etching equipment.

Also, in the case that the roughness is insufficient by only the desmear process, after the desmear process is performed, further the surface of the primer layer 32 may be roughened by the plasma process, or the like.

In turn, as depicted in FIG. 5A, second wiring layers 22 each connected to the first wiring layer 20 through the first via hole VH1 are formed on the first interlayer insulating layer 40 on both surface sides of the core substrate 10 respectively. The second wiring layers 22 are formed by the semi-additive method, for example.

Explaining in more detail, first, on both surface sides of the structural body in FIG. 4D, a seed layer (not shown) such as a copper layer, or the like is formed on the primer layer 32 and the inner walls of the first via holes VH1 by the electroless plating or the sputter method respectively.

Subsequently, a plating resist (not shown) in which opening portions are provided in the areas containing the first via holes VH1, on which the second wiring layer 22 is arranged, is formed on the seed layer. Then, a metal plating layer (not shown) such as a copper layer, or the like is formed in the opening portions of the plating resist by the electroplating utilizing the seed layer as a plating power feeding path.

Further, after the plating resist is removed, the seed layer is etched while using the metal plating layer as a mask. Thus, the second wiring layers 22 are obtained.

Then, as depicted in FIG. 5B, on both surface sides of the core substrate 10, an uncured resin film is pasted on the first interlayer insulating layer 40 and the second wiring layers 22 by the thermal press. Thus, a second interlayer insulating layer 42 is formed on both surface sides respectively.

Then, as depicted in FIG. 5C, on both surface sides of the core substrate 10, the second interlayer insulating layer 42 is processed by the laser. Thus, second via holes VH2 each reaching the second wiring layer 22 are formed on both surface sides respectively.

Subsequently, as depicted in FIG. 6A, according to the method similar to the method of forming the second wiring layer 22 in FIG. 5A, third wiring layers 24 each connected to the second wiring layer 22 through the second via hole VH2 are formed on the second interlayer insulating layer 42 on both surface sides of the core substrate 10 respectively.

Then, as depicted in FIG. 6B, on both surface sides of the core substrate 10, an uncured resin film is pasted on the second interlayer insulating layer 42 and the third wiring layers 24 by the thermal press. Thus, a third interlayer insulating layer 44 is formed on both surface sides respectively. Further similarly, on both surface sides of the core substrate 10, the third interlayer insulating layer 44 is processed by the laser respectively. Thus, third via holes VH3 each reaching the third wiring layer 24 are formed on both surface sides respectively.

Then, as depicted in FIG. 6C, according to the method similar to the method of forming the second wiring layer 22 in FIG. 5A, fourth wiring layers 26 each connected to the third wiring layer 24 through the third via hole VH3 are formed on the third interlayer insulating layer 44 on both surface sides of the core substrate 10 respectively.

After this, as depicted in FIG. 7, a solder resist 46 in which opening portions 46a are provided on connection parts of the fourth wiring layers 26 is formed on the third interlayer insulating layer 44 on both surface sides of the core substrate 10 respectively. Further, as the need arises, a contact layer (not shown) is formed by forming a nickel/gold plating layer, or the like on the connection parts of the fourth wiring layers 26 on both surface sides respectively.

With the above, a wiring substrate 1 according to the embodiment is obtained. In the case that the large size core substrate 10 for the purpose of multi production is used, the resultant structure is cut from the uppermost solder resist 46 to the lowermost solder resist 46 such that individual wiring substrates 1 are obtained from respective product areas.

As depicted in FIG. 7, in the wiring substrate 1 of the embodiment, the core substrate 10 is arranged in the center part in the thickness direction. A thickness of the core substrate 10 is thinned to about 100 μm to 200 μm.

The through holes TH each penetrating in the thickness direction are formed in the core substrate 10. The first wiring layer 20 is formed on both surface sides of the core substrate 10 respectively. The first wiring layers 20 on both surface sides are connected mutually via the penetration electrodes TE which are filled in the through holes TH.

The resin layer containing fiber reinforcement material 30 is formed on both surface sides of the core substrate 10 respectively. The resin layer containing fiber reinforcement material 30 functions as the reinforcement material that reinforces the rigidity of the core substrate 10 which is made to the thinner body. Also, the primer layer 32 is formed on the resin layer containing fiber reinforcement material 30 on both surface sides respectively. The first interlayer insulating layer 40 is formed by the resin layer containing fiber reinforcement material 30 and the primer layer 32.

The first via holes VH1 each reaching the first wiring layer 20 are formed in the first interlayer insulating layer 40 on both surface sides of the core substrate 10 respectively. Also, the second wiring layers 22 each connected to the first wiring layer 20 through the first via hole VH1 are formed on the first interlayer insulating layer 40 on both surface sides respectively.

The primer layer 32 functions as the adhesion layer for forming the second wiring layers 22 on the resin layer containing fiber reinforcement material 30 with good adhesion. The surface of the primer layer 32 is formed as the roughened surface R (FIG. 4D). Therefore, the second wiring layer 22 is formed on the primer layer 32 by the anchor effect with good adhesion.

Also, the second interlayer insulating layer 42 which has the second via holes VH2 each reaching the second wiring layer 22, is formed on the first interlayer insulating layer 40 and the second wiring layers 22 on both surface sides of the core substrate 10 respectively. Further, the third wiring layers 24 each connected to the second wiring layer 22 through the second via hole VH2 are formed on the second interlayer insulating layer 42 on both surface sides respectively.

Also similarly, the third interlayer insulating layer 44 which has the third via holes VH3 each reaching the third wiring layer 24, is formed on the second interlayer insulating layer 42 and the third wiring layers 24 on both surface sides of the core substrate 10 respectively. Further, the fourth wiring layers 26 each connected to the third wiring layer 24 through the third via hole VH3 are formed on the third interlayer insulating layer 44 on both surface sides respectively.

Also, the solder resist 46 in which the opening portions 46a are provided on the connection parts of the fourth wiring layers 26 is formed on the third interlayer insulating layer 44 on both surface sides of the core substrate 10 respectively.

In the wiring substrate 1 of the embodiment, even though the core substrate 10 is made to the thinner body, because the core substrate 10 is reinforced with the resin layer containing fiber reinforcement material 30, such core substrate 10 has enough rigidity. Accordingly, even though the heating process at the time when a resin film is thermally pressed, etc. are repetitively performed in the steps of manufacturing the wiring substrate 1, the core substrate 10 can withstand the thermal stress which is caused in the inside thereof.

By this matter, it can be prevented that the twist or the warp is caused in the wiring substrate 1. Also, since the rigidity of the core substrate 10 is reinforced, the reliability in the handling property and the conveyance of the core substrate 10 can be improved.

Also, it is difficult to roughen appropriately the surface of the resin layer fiber containing reinforcement material 30. For this reason, the primer layer 32 is formed on the resin layer containing fiber reinforcement material 30 as an adhesion layer. As described above, the roughened surface R can be easily formed on the surface of the primer layer 32 which is formed of an epoxy resin, or the like, by performing the desmear process. Therefore, the second wiring layers 22 can be formed with good adhesion by the anchor effect.

Like the above, in the wiring substrate 1 of the present embodiment, the core substrate 10 is reinforced by the resin layer containing fiber reinforcement material 30, and also the primer layer 32 is formed thereon. Thereby the generation of the warp of the core substrate 10 can be prevented, and the adhesion of the second wiring layers 22 can be ensured. By this matter, even though the case that the wiring substrate 1 is made to the thinner body, enough reliability can be ensured.

In the example of the present embodiment, the first to fourth wiring layers 20, 22, 24, 26 connected mutually via the penetration electrodes TE are formed on both surface sides of the core substrate 10. In this case, the number of stacked layers of the wiring layers may be set arbitrarily.

Also, the multilayer wiring which includes the resin layer containing fiber reinforcement material 30 and the primer layer 32 may be formed only on the one side of the core substrate 10.

Figure 8:
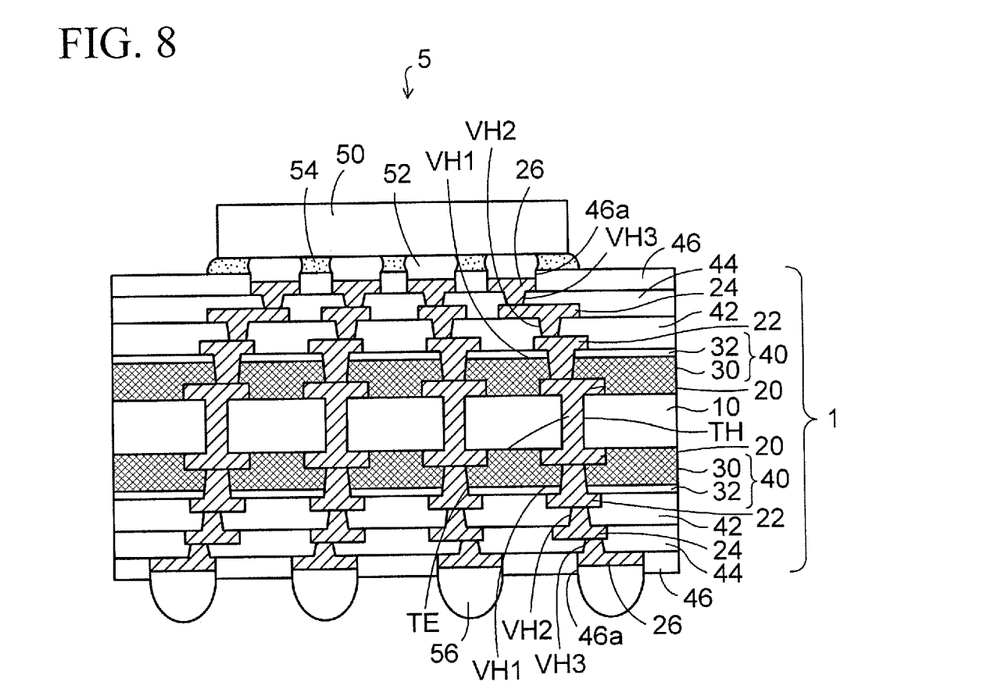
FIG. 8 is a sectional view depicting an example of a semiconductor device using the wiring substrate in FIG. 7.

Also, as depicted in FIG. 8, bump electrodes 52 of a semiconductor chip 50 are flip-chip connected to the connection parts of the fourth wiring layers 26 on the upper surface side of the wiring substrate 1 in FIG. 7. Further, an underfill resin 54 is filled into a clearance between the semiconductor chip 50 and the wiring substrate 1. Also, external connection terminals 56 are provided by mounting solder balls on the connection parts of the fourth wiring layer 26 on the lower surface side of the wiring substrate 1, or the like.

By this matter, a semiconductor device 5 using the wiring substrate of the present embodiment can be obtained. The narrow pitch of the bump electrodes 52 of the semiconductor chip 50 is pitch-converted by the first to fourth wiring layers 20, 22, 24, 26 on both surface sides of the wiring substrate 1, such that the narrow pitch of the bump electrodes 52 of the semiconductor chip 50 corresponds to the wide pitch of the connection electrodes of the mounting substrate.

Then, the external connection terminals 56 of the semiconductor device 5 are connected to the connection electrodes of the mounting substrate such as the motherboard, or the like.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a wiring substrate, comprising:
obtaining an interlayer insulating layer by forming a laminated body, in which a resin layer containing fiber reinforcement material and a primer layer are laminated in sequence, on a core substrate including a first wiring layer;
forming a via hole reaching the first wiring layer, by processing the interlayer insulating layer; and
forming a second wiring layer connected to the first wiring layer through the via hole, on the primer layer.

(Clause 2) A wiring substrate according to clause 1, wherein a thickness of the core substrate is 100 µm to 200 µm.

(Clause 3) A wiring substrate according to clause 1, after forming the via hole, further comprising:
performing a desmear process to an inside of the via hole; and
wherein a surface of the primer layer is formed as a roughened surface by the desmear process.

(Clause 4) A method of manufacturing a wiring substrate, according to clause 1, wherein the first wiring layer is formed on both surface sides of the core substrate, and is connected mutually via a conductor layer formed in a through hole of the core substrate, and the obtaining the interlayer insulating layer, the forming the via hole, and the forming the second wiring layer are performed on the both surface sides of the core substrate.

What is claimed is:

1. A wiring substrate, comprising:
a core substrate including a first wiring layer;
an interlayer insulating layer formed by a resin layer containing fiber reinforcement material formed on the core substrate and a primer layer formed on the resin layer containing fiber reinforcement material, and the interlayer insulating layer having a via hole reaching the first wiring layer, wherein the resin layer has a top surface furthest away from the core substrate, and wherein the primer layer is formed exclusively on an entire region of the top surface of the resin layer, and the primer layer is formed of a resin film; and
a second wiring layer formed on the primer layer, and connected to the first wiring layer through the via hole, wherein a thickness of the primer layer is set thinner than a thickness of the resin layer containing fiber reinforcement material, and no wiring layer exists between the resin layer containing fiber reinforcement material and the primer layer.

2. A wiring substrate according to claim 1, wherein a thickness of the core substrate is 100 μm to 200 μm.

3. A wiring substrate according to claim 1, wherein a surface of the primer layer is formed as a roughened surface, and the second wiring layer is formed on the roughened surface.

4. A wiring substrate according to claim 1, wherein the first wiring layer is formed on both surface sides of the core substrate, and is connected mutually through a conductive layer formed in a through hole of the core substrate, and
the interlayer insulating layer and the second wiring layer are formed on the both surface sides of the core substrate respectively.

* * * * *